United States Patent [19]
Gillig

[11] Patent Number: 5,604,468
[45] Date of Patent: Feb. 18, 1997

[54] FREQUENCY SYNTHESIZER WITH TEMPERATURE COMPENSATION AND FREQUENCY MULTIPLICATION AND METHOD OF PROVIDING THE SAME

[75] Inventor: Steven F. Gillig, Roselle, Ill.

[73] Assignee: Motorola, Inc., Schaumburg, Ill.

[21] Appl. No.: 635,487

[22] Filed: Apr. 22, 1996

[51] Int. Cl.⁶ .................. H03L 1/02; H03L 7/06; H03L 7/16; H03L 7/18
[52] U.S. Cl. .................. 331/176; 331/16; 331/18; 331/25; 455/260; 327/105
[58] Field of Search .................. 331/1 A, 16, 18, 331/23, 25, 66, 176, 177 R, 179; 327/105–107, 156–159; 455/260

[56] References Cited

U.S. PATENT DOCUMENTS

| | | | |
|---|---|---|---|
| 4,454,483 | 6/1984 | Baylor | 331/11 |
| 4,644,297 | 2/1987 | Olds | 331/17 |
| 5,126,699 | 6/1992 | Kabler | 332/124 |
| 5,216,389 | 6/1993 | Carralero et al. | 331/18 |
| 5,355,098 | 10/1994 | Iwasaki | 331/14 |
| 5,477,194 | 12/1995 | Nagakura | 331/10 |
| 5,485,127 | 1/1996 | Bertoluzzi et al. | 331/176 X |

OTHER PUBLICATIONS

"Performance Tests on an MCXO Combining ASIC and Hybrid Construction," 45th Annual Symposium on Frequency Control, 1991, IEEE. Benjaminson et al. Issued 1991 pp. 393–397.

*Primary Examiner*—David Mis
*Attorney, Agent, or Firm*—Gary J. Cunningham

[57] ABSTRACT

A frequency synthesizer (200) with temperature compensation and frequently multiplication. The synthesizer (200) having a temperature uncompensated frequency oscillator (202) coupled to a phase locked loop (206) including at least one temperature compensating and frequency multiplication element (208). The element (208) preferably being a multi-modulus divider. The element (208) is programmed by a control circuit (210) to vary as a function of temperature and to vary as a function of a fractional frequency multiplication factor. The element (208) also may provide adjustment of the nominal frequency of the frequency oscillator (202). The frequency oscillator (202) and preferably all the elements of the synthesizer (200) are temperature compensated by the element (208) to produce a temperature stable multiplied output frequency (238).

24 Claims, 10 Drawing Sheets

FIG. 1

—PRIOR ART—

FREQUENCY SYNTHESIZER WITH TEMPERATURE COMPENSATION AND FREQUENCY MULTIPLICATION AND METHOD OF PROVIDING THE SAME

FIELD OF THE INVENTION

The present invention relates generally to frequency synthesizers used in conjunction with piezoelectric frequency oscillators in a multi-channel radio and, in particular, to a frequency synthesizer with temperature compensation and frequency multiplication and method of providing the same.

BACKGROUND OF THE INVENTION

Frequency synthesizers have typically been provided with reference frequency signals from crystal controlled frequency oscillators having temperature compensation circuits for use in frequency stabilized radio communications. These compensation circuits may be composed of analog or digital devices and are used to provide a relatively flat frequency output over temperature. Typically, a capacitive element is provided to allow absolute adjustment of the final frequency of the oscillator. This capacitive element is generally either in the form of a trim capacitor or an analog varactor controlled by an applied DC voltage. By adjusting this capacitance, the user is able to adjust (warp) the oscillator onto a desired final frequency.

As should be recognized by those skilled in the prior art, the frequency adjustment range (warpability) of a crystal controlled frequency oscillator is limited by the physical size of the crystal and its electrodes. An increase in warpability necessitates the use of a crystal with an increased width-to-thickness ratio. However, an increase of width-to-thickness ratio causes a crystal to be more fragile and more costly than a crystal without a higher warpability requirement. Further, the long term stability of a highly warpable crystal is compromised due to its more sensitive nature.

Warpability may also be increased by the use of a capacitive element having a larger tuning range. However, this typically requires that the element be of a physically larger size. Along with increasing the cost and size of the oscillator, the size of the element may bring other problems. In particular, analog varactors are necessarily large and do not scale as well with integrated circuit process shrinks as do digital circuits. Additionally, these reactive elements have their own variation with temperature, outside of the crystal temperature variation, which must be controlled by an applied voltage, as well as being compensated along with the crystal temperature variation. For good temperature performance of a varactor, a high supply voltage is needed for bias. However, this restricts the use of a lower voltage, single-supply operated frequency oscillator. Further, the oscillator AC voltage output swing must also be controlled to prevent the varactor from conducting.

In typical frequency synthesizer applications, the frequency is manipulated three or more times. First, a crystal controlled frequency oscillator has temperature compensation circuitry applied to provide a relatively flat frequency output over temperature. Second, the oscillator is warped onto a desired frequency. Third, this corrected oscillator frequency is multiplied in a phase locked loop (PLL) to produce the higher frequencies required in local oscillators in radio communications equipment. It would be advantageous to temperature compensate a synthesizer output frequency with a single element without incorporating additional synthesizer elements.

There is a need for a temperature compensated frequency oscillator using a PLL frequency synthesizer which: achieves more accurate, linear and repeatable temperature compensation with more simplified circuitry; does not need tunable reactive elements to warp the oscillator onto the desired frequency thereby allowing smaller, less expensive elements to be used; provides a temperature-dependent frequency multiplying element whereby temperature compensation of the crystal oscillator and other circuit elements in the frequency synthesizer is achieved. In addition, it is desirable to provide a low cost, small sized, low current drain, high yield oscillator and PLL that allows control of the temperature compensation of the crystal oscillator and other circuit elements, warping, and frequency multiplication of the PLL without incurring any detrimental spurious frequency responses.

DETAILED DESCRIPTION OF THE PREFERRED EMBODIMENT

Figure 1:
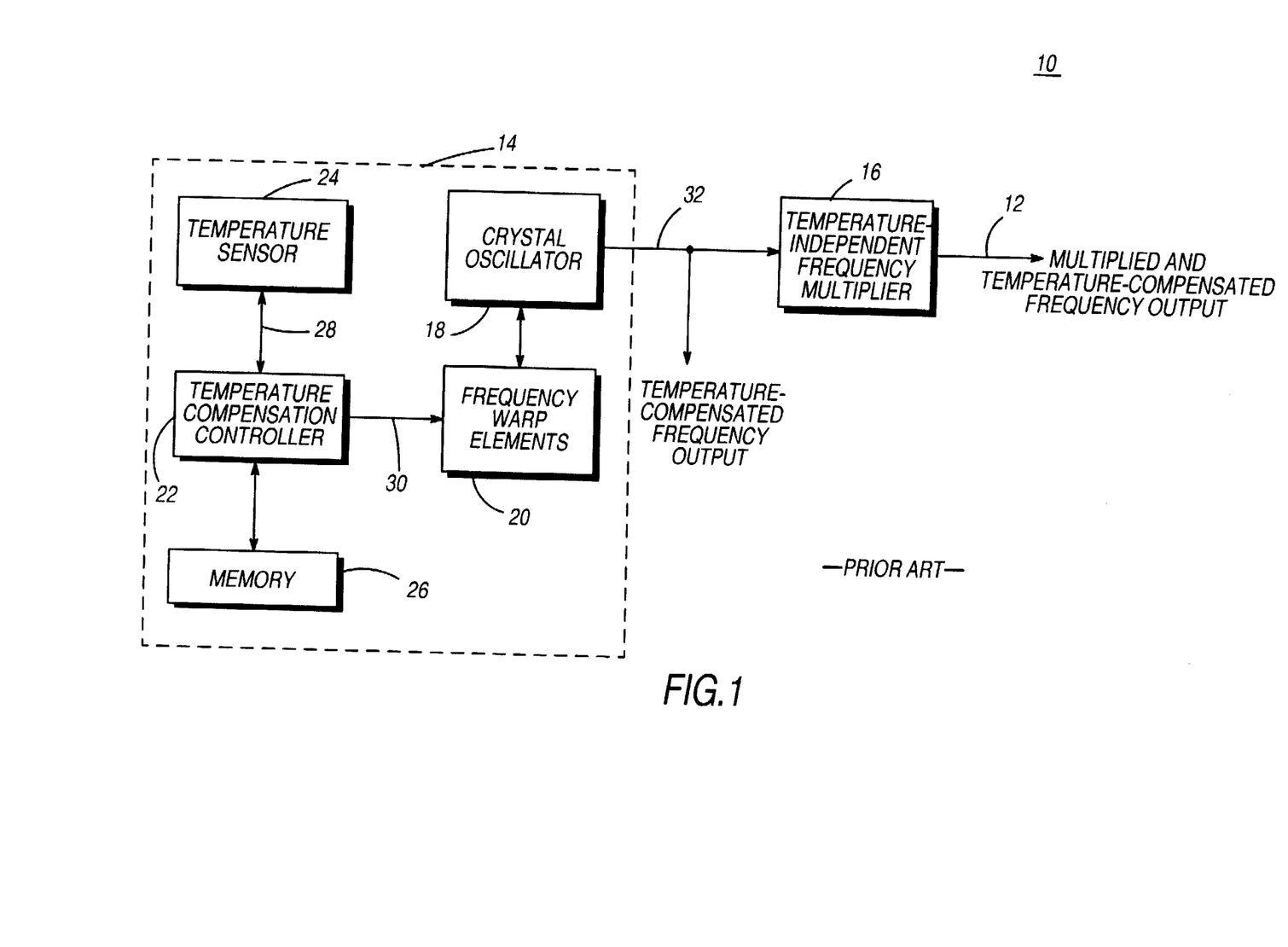
FIG. 1 is a block diagram of a prior art circuit which provides a temperature compensated reference frequency signal to a temperature-independent frequency multiplier.

FIG. 1 shows a prior art frequency source 10 providing a multiplied and temperature compensated frequency output 12. In this device a temperature compensated frequency oscillator 14 is coupled to a temperature-independent frequency multiplier 16 which provides the desired frequency output 12.

The frequency oscillator 14 includes a crystal oscillator 18, at least one frequency warp element 20 which is typically a varactor, a temperature compensation controller 22, a temperature sensor 24, and a memory 26. The memory 26 contains a preprogrammed lookup table of temperature compensating data for the crystal that correspond to predetermined temperature varying voltage signals provided by the temperature sensor 24. Typically, the sensor 24 is located in proximity to the crystal to reduce errors which may arise due to temperature gradients across the frequency oscillator 14. The sensor 24 provides a temperature indicating signal 28 to the controller 22 which directs the controller 22 to look-up the crystal compensation data in the memory 26 corresponding to the sensor signal 28. The controller 22 then directs a corresponding adjustment voltage signal 30 to the warp elements 20 to change their capacitance. The warp elements 20 are coupled to the frequency oscillator circuit 18 such that a change in capacitance will cause a corresponding change in the frequency output 32 of the frequency oscillator 14. In this way, the frequency oscillator 14 provides a relatively stable temperature compensated frequency output 32 to couple to the frequency multiplier 16. The frequency oscillator 14 may also include an external DC voltage-warp signal (not shown) to allow the adjustment of the frequency oscillator 14 to a particular output frequency 32.

The frequency multiplier 16 is typically a frequency synthesizer incorporating a phase locked loop (PLL). PLL frequency synthesizers based on approaches such as fractional division or sigma-delta modulation are devices known in the art to realize temperature-independent frequency multiplication greater than one. Similarly, frequency dividers are devices known in the art to realize temperature-independent frequency multiplication less than one. Typically, the frequency multiplier 16 takes the temperature compensated frequency output 32 from the frequency oscillator 14 and multiplies it to output another, usually higher, frequency 12 for use as a local oscillator in radio communications equipment.

The disadvantage of this prior art frequency source 10 is that multiple adjustments of frequency occur in the circuit, each adjustment requiring particular additional circuitry of its own. The frequency oscillator 14 requires warp elements 20 to provide temperature compensation of the crystal, and the frequency source 10 requires a multiplier circuit 16 to translate the output frequency 12. The warp elements 20 typically include large non-linear analog varactors which require a particular crystal design that is more sensitive to capacitive load changes. Further, the more sensitive crystal design also makes the crystal more sensitive to temperature variations and aging. In addition, the temperature variations of the other components in the frequency source are not compensated.

Figure 2:
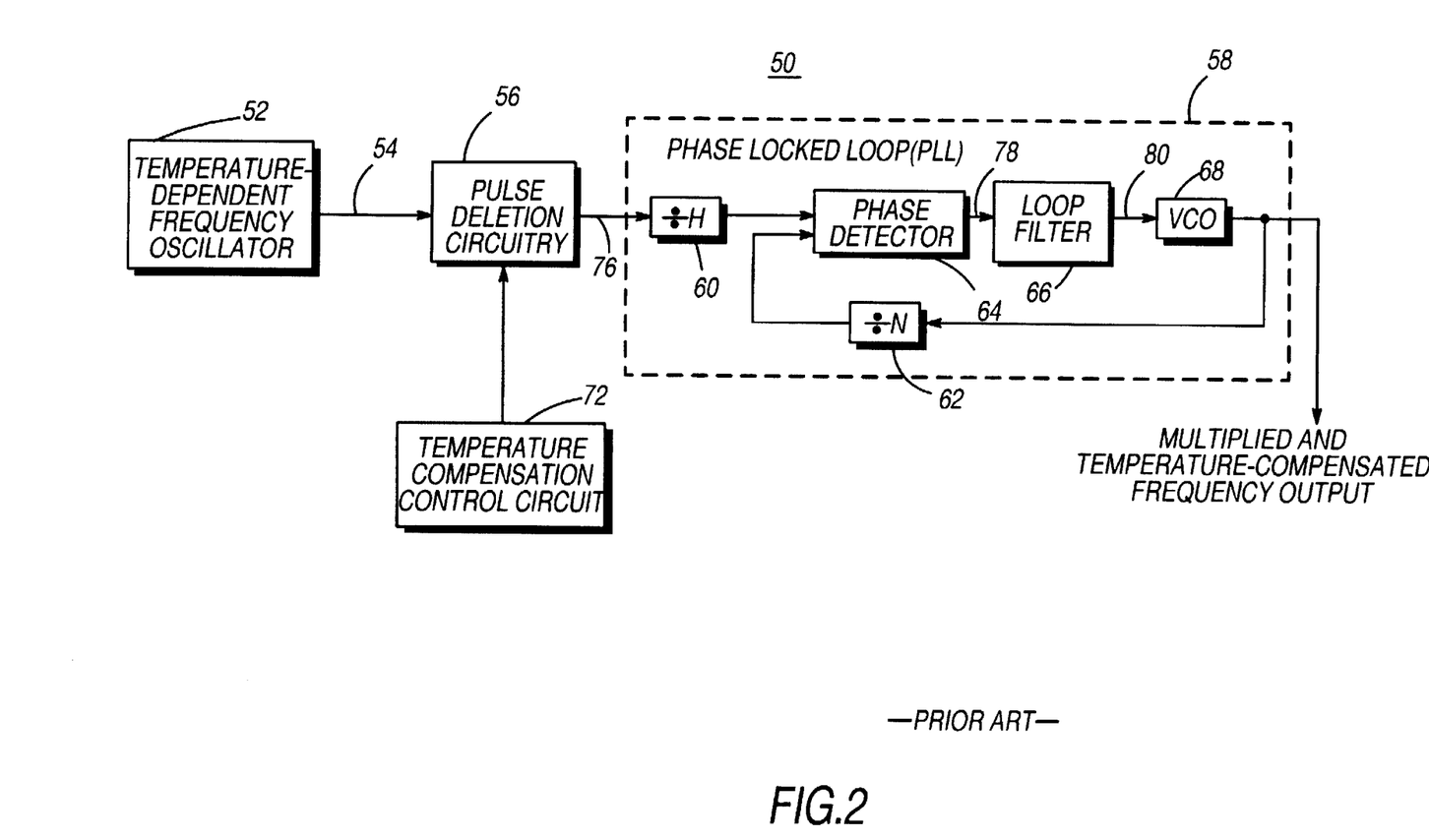
FIG. 2 is a block diagram of a prior art circuit which provides pulse deletion circuitry to temperature compensate a temperature-dependent frequency signal which is then applied to a temperature-independent PLL.

FIG. 2 shows another prior art frequency source 50 that utilizes a frequency oscillator 52 that is allowed to vary frequency over temperature. In this source 50, the oscillator output 54 is temperature dependent, but is subsequently compensated by a pulse deletion circuit 56 to provide temperature correction of the output 54 before being coupled to a PLL 58. The PLL 58 includes a first divider 60, a second divider 62, a phase detector 64, a low-pass loop filter 66, and a voltage controlled oscillator (VCO) 68. Also, the source includes a temperature compensation control circuit 72 for controlling the pulse deletion circuit 56.

The output 54 of the frequency oscillator 52 is a temperature-varying square wave pulse train which is coupled through the pulse deletion circuitry 56 to the PLL 58. The control circuit 72 directs the pulse deletion circuitry 56 to delete pulses from the pulse train to lower the frequency in accordance with temperature variations of the frequency oscillator 52. In this way, a relatively stable temperature compensated frequency output 76 is coupled to the PLL 58.

The output from the pulse deletion circuitry 76 is frequency divided by the first divider 60 and input to a phase detector 64 as a reference signal. An output from the VCO 68 for outputting a desired frequency is divided by the second divider 62 and input into the phase detector 64. The phase detector 64 outputs a phase difference signal 78 through the loop filter 66 to a control terminal 80 of the VCO 68. The loop filter 66 reduces switching transients generated in the phase detector 64 by missing pulses in the pulse train.

The disadvantage of this prior art frequency source 50 is that pulse deletion forces the phase detector 64 to generate a long phase difference signal 78 to the VCO 68 over any time period where a pulse is missing. This switching between long and short phase difference signals 78 generates sideband signals in the VCO 68 which may cause radio communication transceivers to receive or transmit on an incorrect frequency. This necessitates the use of a very low frequency low-pass loop filter 66 which requires large filter components and causes slow lock times. For example, a 1 ppm correction in a 15 MHz reference signal requires the deletion of 15 pulse/second from the pulse train, which causes 15 Hz phase difference signals 78 at the loop filter 66. The loop filter 66 needs to reject the 15 Hz signals 78 to be effective. A 15 Hz filter typically requires large components which is a disadvantage.

Figure 3:
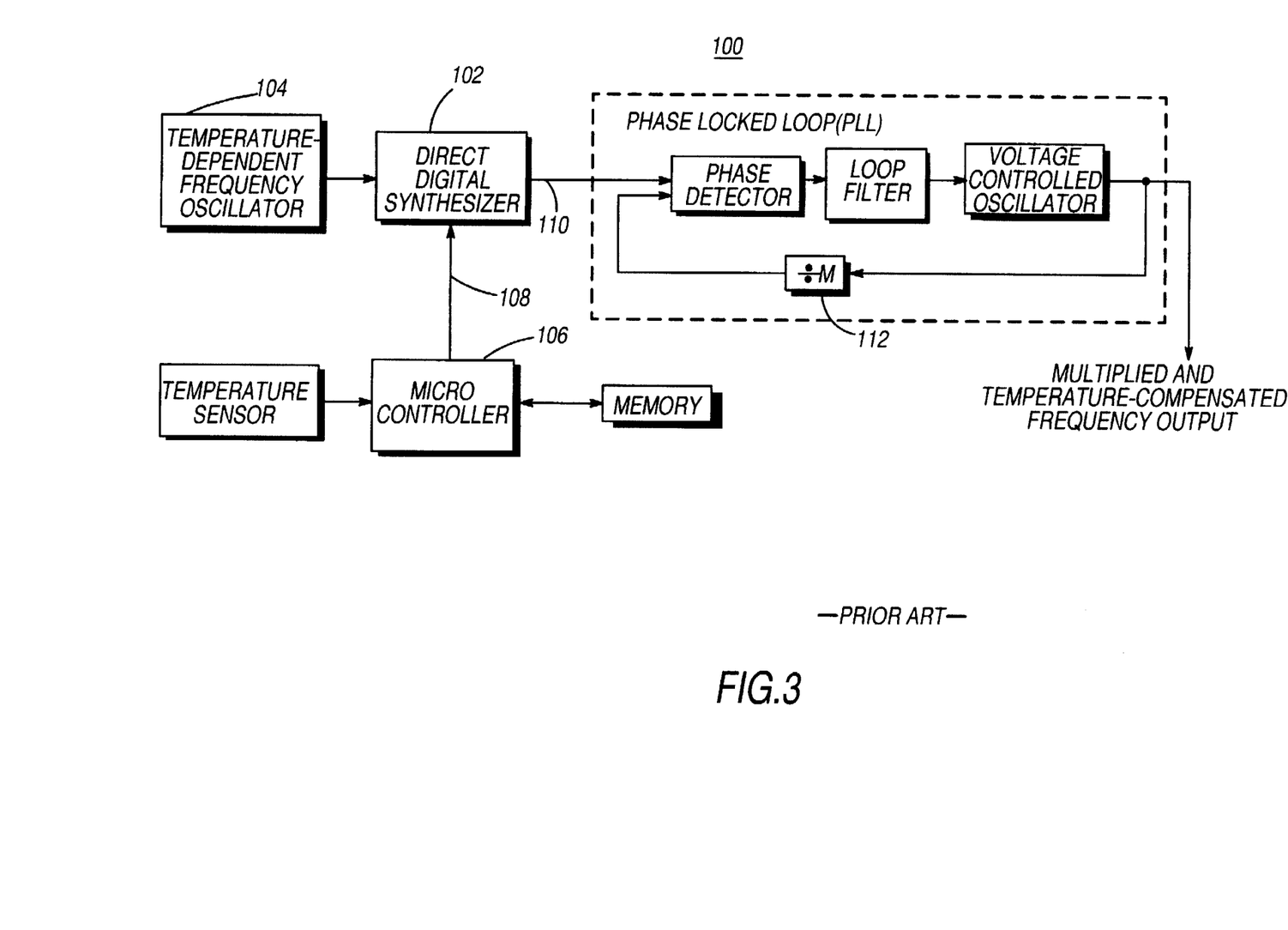
FIG. 3 is a block diagram of a prior art circuit which utilizes a direct digital synthesizer to temperature compensate a temperature-dependent frequency signal which is then applied to a temperature-independent PLL.

FIG. 3 shows another prior art frequency source 100 that has very similar circuitry to the source of FIG. 2, but utilizes a direct digital synthesizer (DDS) 102 in place of the pulse deletion circuit of FIG. 2. The DDS 102 is clocked by the signal from the temperature-dependent frequency oscillator 104, a micro-controller 106 performs a temperature compensating bit correction, and a D-A converter in the DDS 102 converts the corrected data 108 into an temperature compensated frequency output 110. This source 100 has the advantage of generating a regular pulse train which reduces sideband signals, but at the expense of large current drain in the D-A converter. Further, this source 100 has the disadvantage of requiring additional frequency multiplication elements 112 in the circuit to obtain a desired multiplied output, and the temperature variations of the other components in the source are not compensated.

Figure 4:
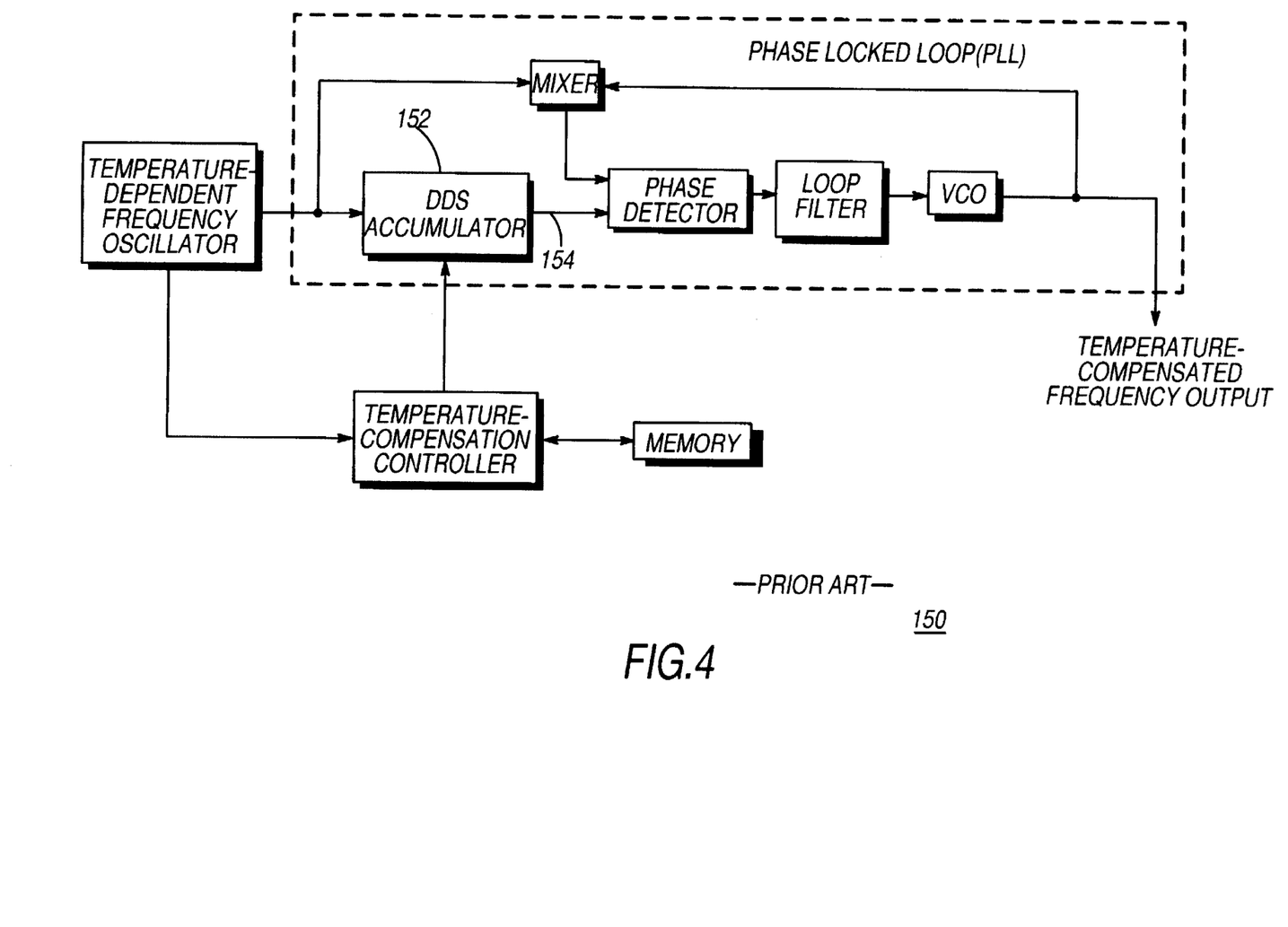
FIG. 4 is a block diagram of a prior art circuit which provides a temperature compensating signal to a direct digital synthesizer (DDS) accumulator in a PLL to correct for a temperature-dependent frequency oscillator.

FIG. 4 shows another prior art frequency source 150 that utilizes a DDS accumulator 152 to provide temperature compensation of a frequency oscillator 156 and to achieve fine frequency resolution. This source 150 has the disadvantage of poor spurious performance at an output 154 of the accumulator 152 due to the use of a single accumulator which takes its output from the high bit of an accumulator register. It should be recognized that accumulators are well known in the art. This approach requires significant filtering similar to that required by the pulse deletion circuit 56 of FIG. 2.

Figure 5:
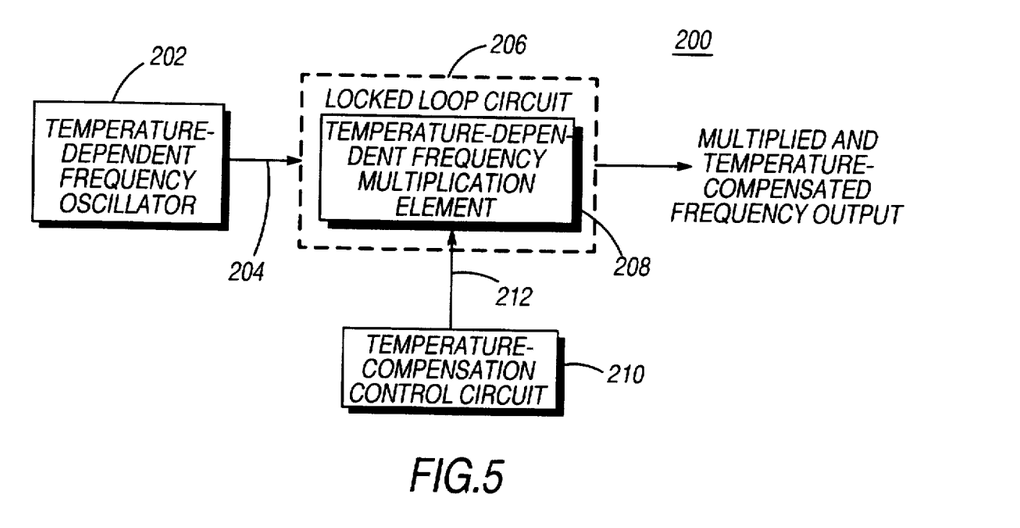
FIG. 5 is a block diagram of a circuit which provides a temperature-dependent element coupled to a locked loop circuit used to temperature compensate a signal from a temperature-dependent frequency oscillator and to give the locked loop circuit a temperature-dependent multiplication factor, in accordance with the present invention.

FIG. 5 shows a general implementation of a frequency synthesizer 200 in accordance with the present invention. A signal 204 from an uncompensated, temperature-dependent reference frequency oscillator 202 is input to a locked loop circuit 206 which contains a temperature-dependent frequency multiplying element 208. The locked loop circuit 206 may be a phase locked loop, a frequency locked loop or a delay locked loop. In particular, a phase locked loop circuit would include a phase detector, a frequency locked loop circuit would include a frequency detector and a delay locked loop circuit would include a delay detector. In one embodiment, the locked loop circuit 206 is a phase locked loop and the element 208 is a multi-modulus divider, preferably adjusted by a noise shaping digital modulator to permit fractional division of a frequency, allowing finer resolution than integer dividers.

In a preferred embodiment, the element 208 is a dual-modulus divider and is varied, dependent upon temperature, to temperature compensate the frequency oscillator 202. This is achieved by a temperature compensation control circuit 210 which applies a temperature-dependent control signal 212 to the element 208. The element 208 is used, not only to temperature compensate the frequency oscillator 202, but also to multiply the oscillator frequency and provide frequency synthesis. The element 208 may also be used to temperature compensate all of the components of the frequency synthesizer circuit 200. This is advantageous over the prior art where temperature-dependent components are independently temperature compensated. The use of a single temperature compensating element 208, provides a great simplification over prior art synthesizers, in addition to the corresponding lower cost and lower current drain.

The present invention provides another advantage in that the frequency oscillator is no longer required to provide a crystal with a particular sensitivity. This is because the crystal oscillator does not need an expansive warp range to be warped onto a nominal frequency. This frequency adjustment function can now be performed in conjunction with the multiplying function of the element 208. Therefore, a less sensitive and more robust crystal can be used which lowers cost. Also, a less sensitive crystal has better long term stability (aging). In addition, there is no longer a need for large tunable reactive elements such as varactors to warp the oscillator onto a desired frequency.

Figure 6:
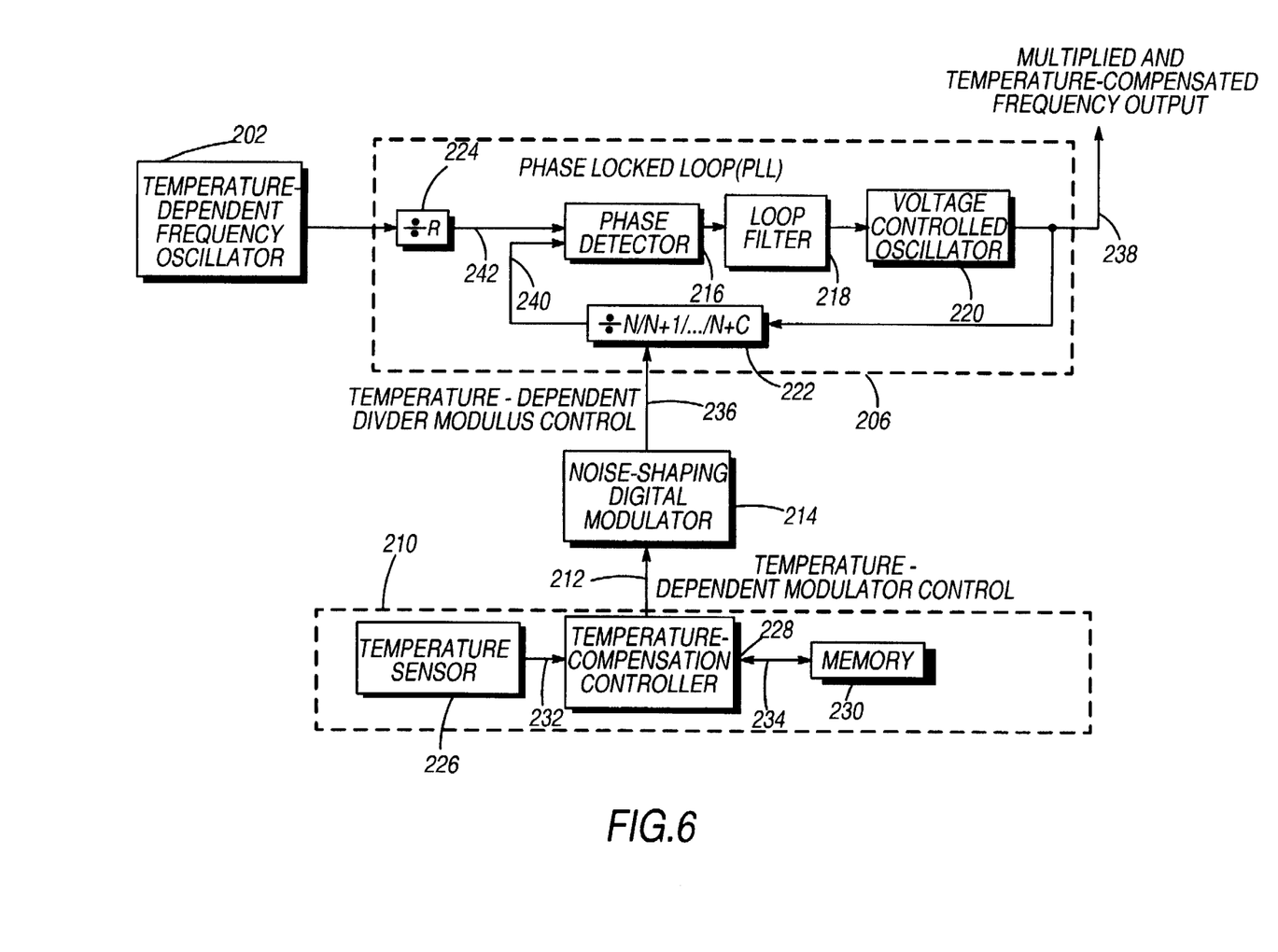
FIG. 6 is one embodiment of the circuit of FIG. 5 wherein the locked loop circuit is a PLL and the temperature-dependent multiplication element is a multi-modulus frequency divider being fed by a noise-shaping digital modulator signal, in accordance with the present invention.

FIG. 6 shows one embodiment of the present invention including a temperature dependent frequency oscillator 202, a locked loop circuit 206, shown as a PLL, a noise-shaping digital modulator 214, and a temperature compensation control circuit 210. The locked loop circuit 206 includes a phase detector 216 having an output coupled to a loop filter 218 having an output coupled to a voltage controlled oscillator 220 having an output coupled back through a multi-modulus divider 222 in a feedback path 240 of the locked loop circuit 206 to a first input of the phase detector 216. The frequency oscillator 202 applies a frequency to a second input of the phase detector 216 through a signal path 242. Preferably, the oscillator provides a frequency signal through a temperature-independent second divider 224 which improves flexibility in frequency output 238 selection. The control circuit 210 includes a temperature sensor 226 and a memory 230 being coupled to a temperature compensation controller 228, the controller 228 of the control circuit 210 being coupled to the divider 222 and for controlling the divider 222.

The temperature compensation control circuit 210 monitors a temperature signal 232 from a connecting temperature sensor 226 and uses the temperature signal 232 to look up a value corresponding to the temperature signal 232 in a connecting memory 230. The memory 230 is stored with values predetermined from previous temperature training of the synthesizer. The values have been computed to compensate for output frequency errors produced as the elements of the synthesizer circuit are subjected to varying temperature.

The temperature compensating procedure can use a lookup table, a calculation or a combination of the two equally well for determining the appropriate temperature compensating value. As the sensor 226 indicates a change in ambient temperature, the memory 230 supplies the appropriate corresponding compensation value 234 to the temperature compensation controller 228. The controller 228 produces an appropriate temperature-dependent modulator control signal 212 along with a desired PLL multiplication factor to the divider 222. In a preferred embodiment, the control signal 212 is applied through a noise-shaping digital modulator 214 such that a noise reducing temperature-dependent divider modulus control signal 236 is applied to the divider 222 whereby a multiplied and temperature compensated frequency synthesizer output is achieved.

This is different from the prior art (as shown in FIG. 1) where separate synthesizer elements such as, the reference frequency oscillator are independently temperature compensated. Also, in the case of the prior art oscillator, frequency warp elements are used to provide temperature compensation which does not include temperature compensation of all the elements of a synthesizer. The present invention has the advantage of supplying all temperature compensation and frequency multiplication in a single temperature compensating element without the use of additional frequency warp elements.

In a preferred embodiment, a noise-shaping digital modulator 214 is connected in the control signal path 212 from the controller 228 to the multi-modulus divider 222 to control the divider 222 such that the PLL can achieve good frequency resolution while reducing spurious frequencies. The output of the noise-shaping modulator 214 is made temperature dependent by the temperature compensation control circuit 210. The modulator 214 increments and decrements the modulus of the multi-modulus divider 222 over a particular time period such that an averaged fractional modulus is obtained. It should be recognized that faster switching provides a better averaged modulus. Further, the modulator 214 varies the frequency multiplication factor of the multi-modulus divider 222 as a function of temperature through the temperature-dependent divider modulus control 236 such that a multiplied and temperature compensated synthesizer frequency output 238 is obtained.

The noise-shaping digital modulator 214 can be implemented in various ways. Known implementations of digital modulators in the prior art are fractional-division and sigma-delta modulators, both of which can provide adequate noise-shaping of their outputs. A sigma-delta modulator with a one bit output achieves fine resolution of the divider and therefore fine resolution of the synthesizer frequency output. These modulators serve to create an average divider modulus by varying the divider modulus in such a manner as to shape the noise created as the divider modulus is varied and translate the noise away from a nominal output frequency of the divider.

Figure 7:
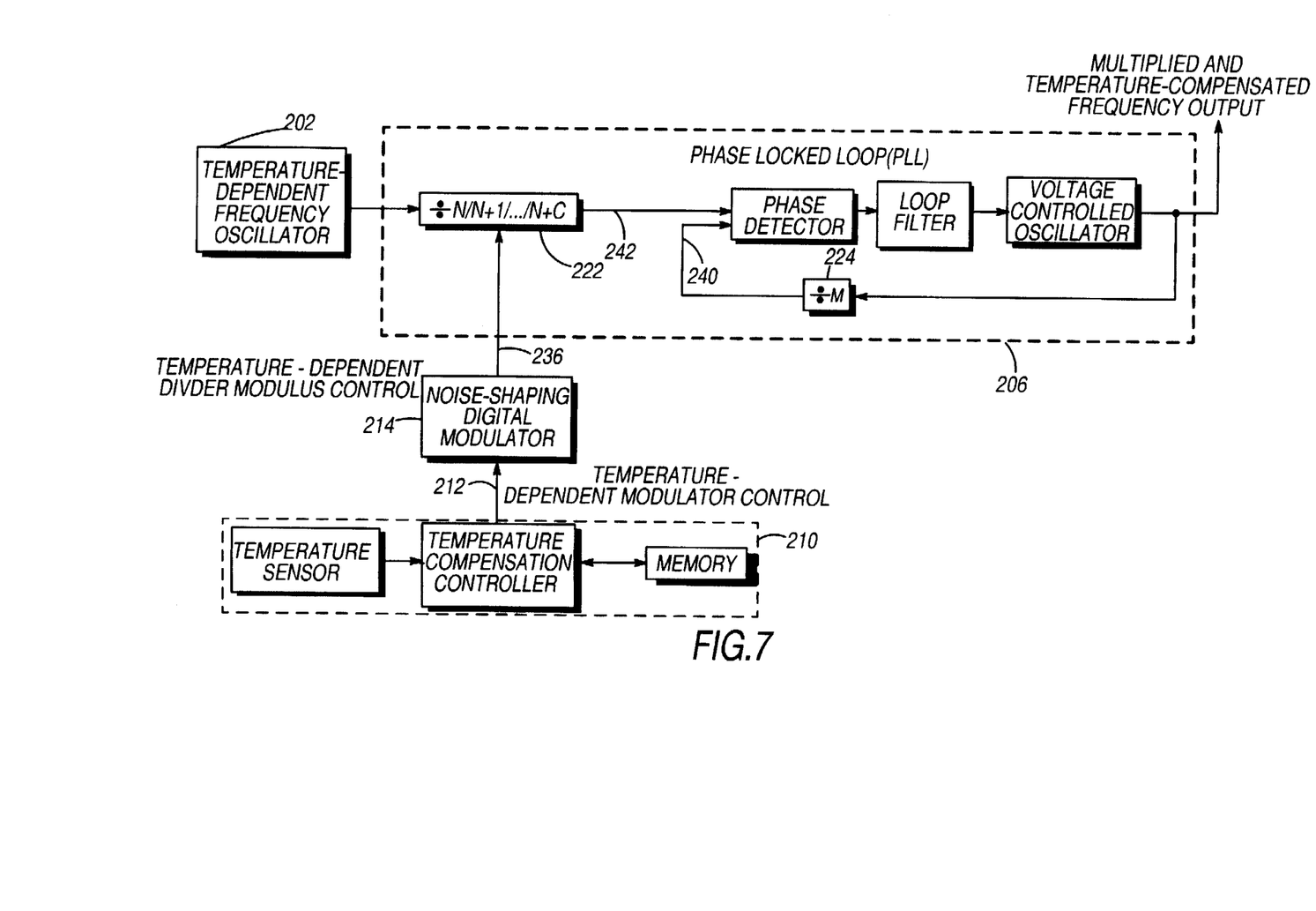
FIG. 7 is a block diagram of a circuit which provides a multi-modulus frequency divider within a PLL to temperature compensate a temperature-dependent frequency oscillator signal which is applied to a PLL to provide a temperature-dependent multiplication factor, in accordance with the present invention.

FIG. 7 shows an alternative embodiment of the synthesizer of FIG. 6 where the temperature dependent multimodulus divider 222 is placed in the signal path 242 of the oscillator 202 and the temperature independent divider 224 is place in the feedback path 240 of the locked loop circuit 206 which is preferably a PLL. It should be recognized that any or all of the dividers in the synthesizer may be controlled with a temperature-dependent signal, but unless the system performance warrants the additional complexity this would be redundant, inefficient and not cost effective.

Figure 8:
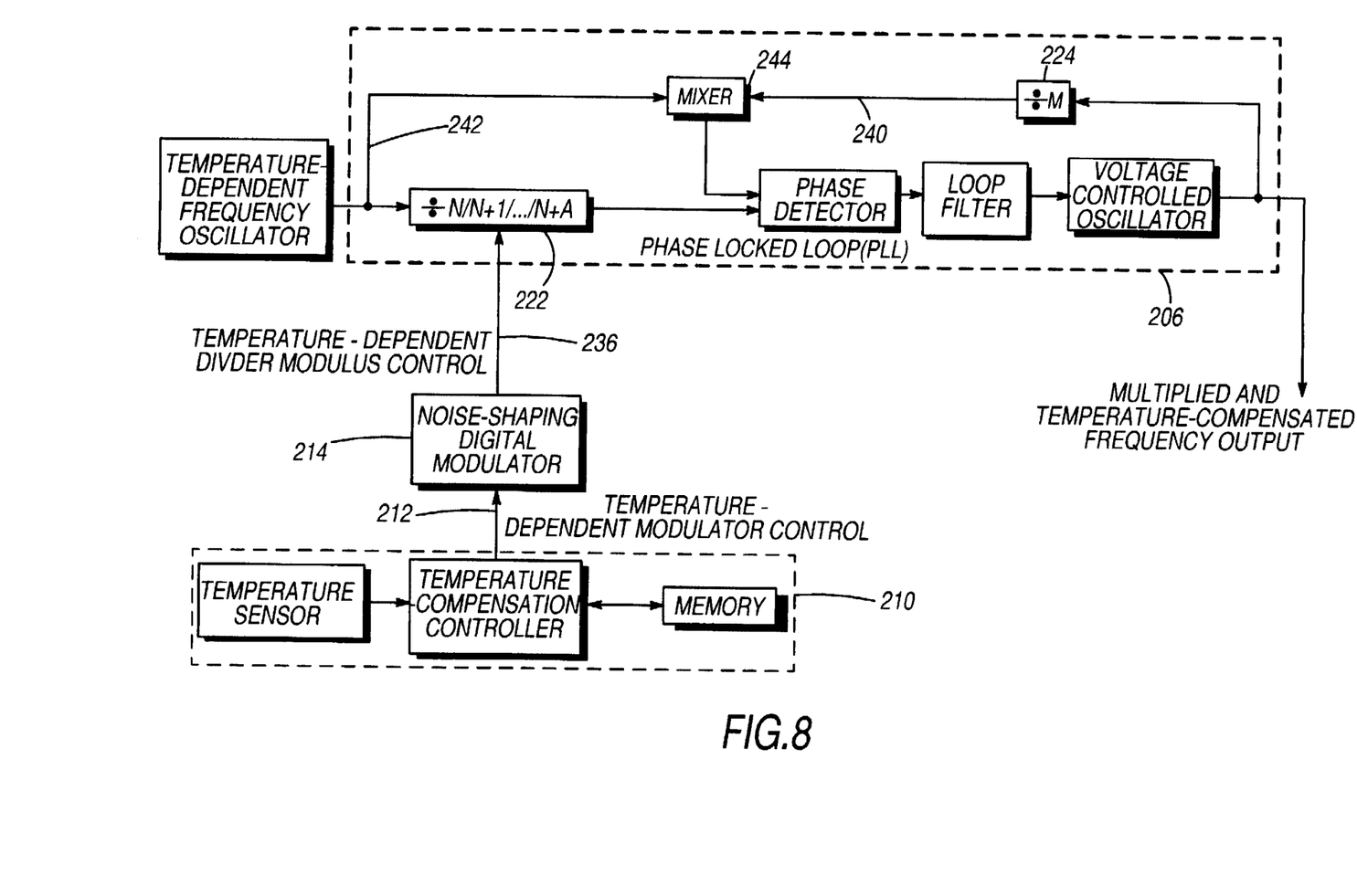
FIG. 8 is a preferred embodiment of the circuit of FIG. 7 wherein an additional mixer in used to increase the resolution of the PLL, in accordance with the present invention.

FIG. 8 shows an alternative embodiment of the synthesizer of FIG. 7 where a mixer 244 is connected in the feedback path 240 and coupled to a feed forward path connecting from the oscillator signal path 242. The additional of the mixer 244 is used to increase the resolution of the locked loop circuit 206.

Figure 9:
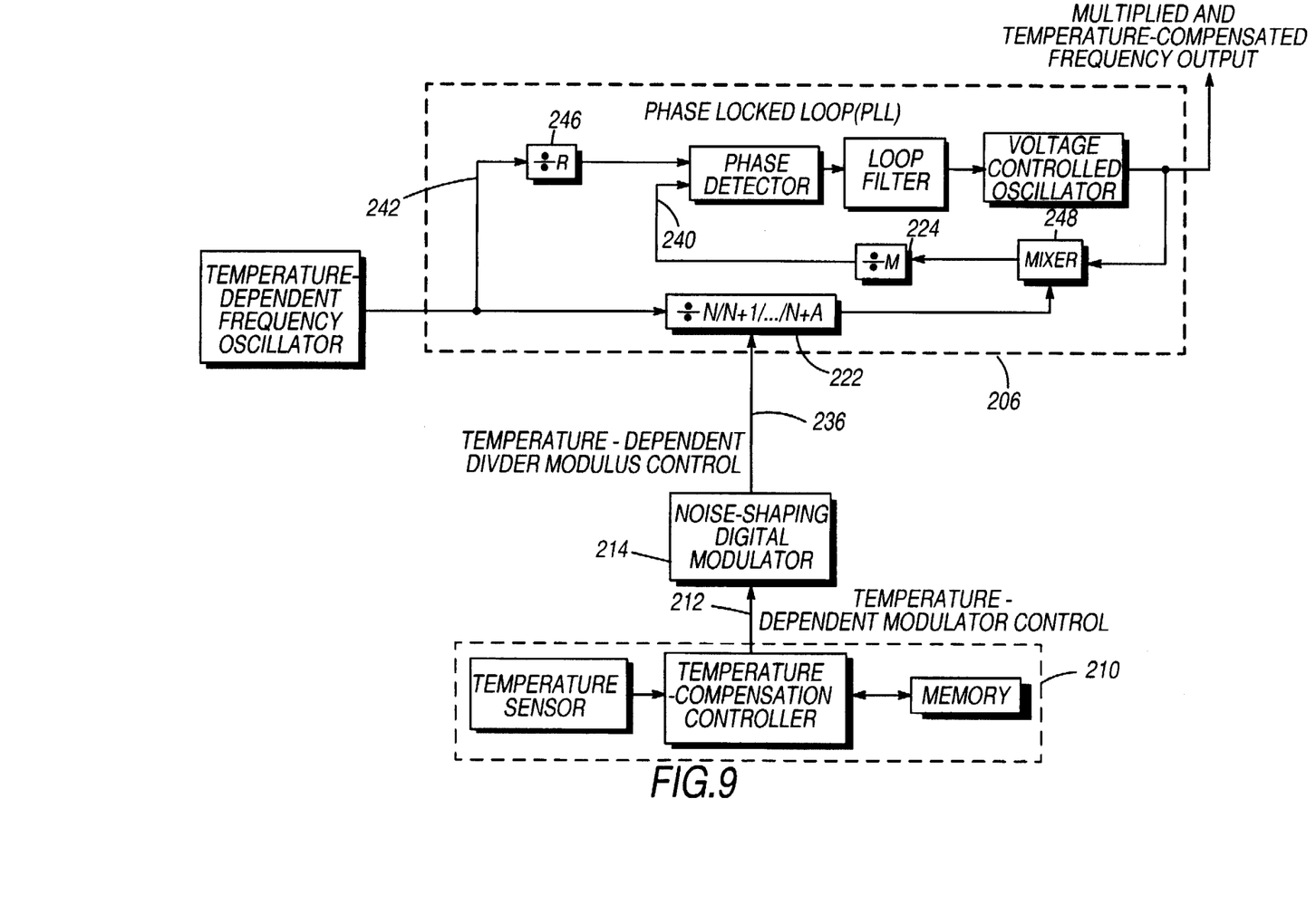
FIG. 9 is a block diagram of a circuit which provides a multi-modulus frequency divider and control circuitry to produce a temperature-dependent frequency signal which is mixed into a PLL loop at a VCO output to provide a temperature-dependent multiplication factor, in accordance with the present invention.

FIG. 9 shows another embodiment of the present invention where a third temperature independent divider 246 is connected in a feed forward path connecting from the oscillator signal path 242, and a temperature independent divider 224 is connected in the feedback path 240 of the locked loop circuit 206 which is preferably a PLL. A mixer 248 is connected in the feedback path 240 and is coupled to the signal path 242 through a multi-modulus divider 222. It should be recognized that various other locked loop configurations are possible using a temperature dependent multi-modulus divider 222. For example, the synthesizer may include more than one each of a feedback path, an oscillator signal path and a feed forward path depending on the resolution or complexity required. In addition, multiple independent locked loop circuits may be controlled in parallel with a control circuit, the independent locked loop signals being combined by a mixer to provide improved resolution. Any or all of these paths may incorporated a temperature dependent multi-modulus divider controlling both temperature compensation and frequency multiplication.

Figure 10:
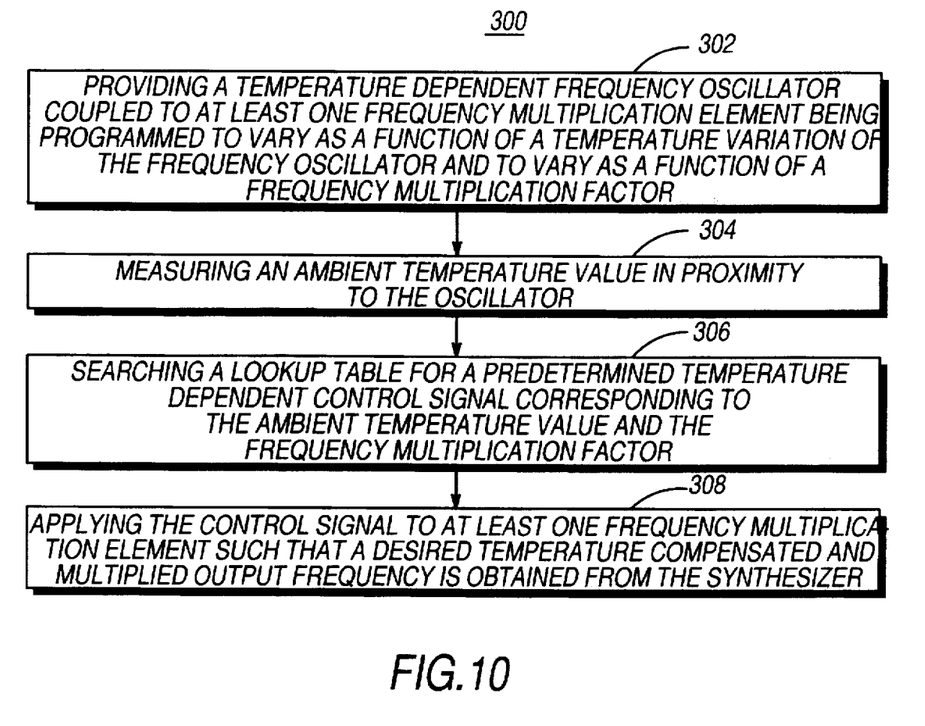
FIG. 10 is a flow diagram of a method to provide a multiplied and temperature compensated frequency output through the use of a temperature-dependent PLL element.

FIG. 10 shows a flow diagram of a method 300 to provide a multiplied and temperature compensated synthesizer frequency output through the use of a temperature-dependent frequency multiplying element, in accordance with the present invention. This method 300 includes a first step 302 of providing a temperature dependent frequency oscillator and at least one frequency multiplication element in a locked loop circuit being programmed both to vary as a function of a temperature variation of the frequency oscillator and to vary as a function of a frequency multiplication factor. In a preferred embodiment, the frequency multiplication element provided is a multi-modulus divider and the locked loop circuit is a phase locked loop.

A second step 304 includes measuring an ambient temperature in proximity to the oscillator and producing an ambient temperature value. A third step 306 includes searching a lookup table for a predetermined temperature dependent control signal corresponding to the ambient temperature value and the desired frequency multiplication factor. Alternatively, this step 306 may include calculating the temperature dependent control signal or a combination of searching and calculating the control signal. A last step 308 includes applying the control signal to the at least one frequency multiplication element such that a desired temperature compensated and multiplied output frequency is obtained from the synthesizer.

Temperature compensation schemes often have the option of correcting for aging in the temperature-dependent frequency oscillator. A linear step size compensation is desirable for aging correction since the training of the temperature compensation is typically done before aging. If the step size of the compensation scheme is non-linear, the aging compensation cannot be added linearly to the temperature compensation. This situation requires the use of non-linear extrapolation circuitry to correctly compensate aging. The use of a noise-shaping digital modulator in the present invention provides additional linearity which is advantageous for use with aging compensation.

The linearity advantage of using a noise-shaping digital modulator in the present invention can be shown by example, with reference to the invention of FIG. 8. First, let the multimodulus divider 222 be controlled by other than a noise-shaping digital modulator. This means that N is a fixed integer value at a given temperature. Let $F_{out}$ be the multiplied and temperature-compensated output frequency and let $F_{osc}$ be the frequency of the temperature dependent frequency oscillator. For a second divider 224 value of M=1:

$$F_{out} = F_{osc}\left(1 + \frac{1}{N}\right)$$

The change in the multiplied and temperature-compensated output frequency, $F_{out}$, with respect to a change in N is:

$$\frac{\partial F_{out}}{\partial N} = \frac{\partial}{\partial N}\left(F_{osc}\left(1 + \frac{1}{N}\right)\right) = \frac{-F_{osc}}{N^2}$$

When normalized to $F_{osc}$ this equation becomes:

$$\frac{(\partial F_{out}/\partial N)}{F_{osc}} = \frac{-1}{N^2}$$

The smallest allowable change in frequency in this example occurs when the integer N changes by 1. This represents the smallest possible frequency resolution at $F_{out}$. In order to change a frequency at $F_{out}$ by 0.1 ppm using only one step in N, it is necessary that N be about 3200, as follows:

$$\text{For}\left|\frac{\partial F_{out}/\partial N}{F_{osc}}\right| = \frac{1}{N^2} = 10^{-7}, \quad N \approx 3162$$

To change frequency by 50 ppm N should range from about 2730 to about 3756 as follows:

$$\frac{\Delta F_{out}}{F_{osc}} = \left(\frac{1}{3162} - \frac{1}{2730}\right) \approx -50 \times 10^{-6}$$

$$\frac{\Delta F_{out}}{F_{osc}} = \left(\frac{1}{3162} - \frac{1}{3756}\right) \approx +50 \times 10^{-6}$$

However, the frequency change per single step in N changes at each extreme. At N=2730, the frequency change per step is:

$$\frac{\Delta F_{out}}{F_{osc}} = \left(\frac{1}{2730} - \frac{1}{2731}\right) = 1.34 \times 10^{-7}$$

which equals a resolution of 0.134 ppm. At the nominal N=3162 the resolution is 0.100 ppm, while at N=3756 the resolution is 0.071 ppm. Therefore, using an integer divider with a nominal 0.1 ppm frequency resolution results in a differential non-linearity of about ±30%.

An attempt to adjust frequency ±50 ppm using the given frequency resolution at N=3162, 0.100 ppm, will produce serious errors. For example, in a linear system ±500 steps (50 ppm/0.100 ppm/step) would be needed to achieve ±50 ppm frequency adjustment. However, due to the non-linearity of frequency resolution, the following frequency changes result;

$$\frac{\Delta F_{out}}{F_{osc}} = \left(\frac{1}{3662} - \frac{1}{3162}\right) = -43.2 \text{ ppm}$$

$$\frac{\Delta F_{out}}{F_{osc}} = \left(\frac{1}{2662} - \frac{1}{3162}\right) = +59.4 \text{ ppm}$$

The integral non-linearity for 500 equal steps of N, both up and down, is −6.8 ppm and +9.4 ppm. At the extremes of the desired +50 ppm range this corresponds to an error of −14% and +19%, respectively. For the invention of FIG. 8, when only integer steps are used in the multi-modulus divider, aging compensation using simple linear addition is substantially impossible when an accuracy of better than ±10 ppm is required.

The present invention provides improved linear compensation performance by using a multi-modulus divider (shown as 222 in FIG. 8) controlled by a noise-shaping digital modulator, thereby reducing the complexity of aging compensation. The noise-shaping digital modulator used in the present invention provides a means of controlling the multi-modulus divider such that it can effectively provide a fractional, non-integer divide value such as N plus a fraction. The digital modulator does this by controlling the multi-modulus divider to divide by more than one value over a specified time interval. Over the specified time interval the effective divide value is a weighted average of the more than one divide values. For example, if the multi-modulus divider is controlled to divide by N for 99% of the time interval and N+1 for 1% of the time interval, the effective divide value of the divider is (N+1/100). This technique allows higher resolution with a small value of N.

The output frequencies of noise-shaping digital modulators have a fundamental frequency and noise sidebands about the fundamental frequency. Noise shaping in a digital modulator is a technique whereby the oversampled output of the digital modulator has its noise shaped in the frequency domain away from the fundamental frequency. This results in the invention having improved noise sidebands and a purer synthesized output frequency. The use of the noise-shaping digital modulator in the present invention reduces the complexity of aging compensation by providing a substantially linear operation of temperature compensation than is possible using only integer values for the multi-modulus divider. The substantially linear operation is described below for comparison with the foregoing integer-only operation.

In a preferred embodiment, the present invention, as shown in FIG. 8 for example, to satisfy the same 0.1 ppm step size requirement and ±50 ppm range, uses a dual-modulus divider of value N=100/101 in conjunction with a fractional-N step size of Num/Den (numerator/denominator). More preferably, a fractional-division noise-shaping modulator is connected in the control signal path of the dual-modulus divider. The noise-shaping modulator uses accumulator lengths of Den=1000 with Num varying from 0 to 1000. With reference to FIG. 8;

$$F_{out} = F_{osc}\left(1 + \frac{1}{(N + (Num/Den))}\right)$$

The resulting change in temperature-compensated output frequency, $F_{out}$, with respect to a fractional change in the effective N for a dual-modulus divider due to a change in Num is:

$$\frac{\partial F_{out}/\partial N}{F_{osc}} = \frac{1}{Den}\left(\frac{-1}{(N + (Num/Den))^2}\right)$$

The smallest resolution possible with the dual-modulus divider comes with a numerator step of 1. At a nominal Num/Den=500/1000 the resolution is 0.099 ppm, while at Num/Den=1000/1000 the resolution is 0.098 ppm and at Num/Den=9/1000 the resolution is 0.100 ppm. In this example, the dual-modulus divider controlled by a fractional-division noise-shaping digital modulator gives a surprising result of a differential non-linearity of about ±1% which is much improved over the differential non-linearity of about ±30% resulting from the use of a fixed integer for N. In addition, the integral non-linearity of the invention is unexpectedly about ±0.5% which reduces error at the extremes of the desired ±50 ppm range to about 0.25 ppm. Therefore, the dual-modulus divider has the advantage of making aging compensation possible using simple linear addition when an accuracy of better than 0.5 ppm is required.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. A frequency synthesizer with temperature compensation and frequency multiplication, comprising:

a temperature dependent frequency oscillator;

at least one frequency multiplication element, the element programmed to vary as a function of a temperature variation of the frequency oscillator and to vary as a function of a frequency multiplication factor;

at least one locked loop circuit chosen from the group consisting of a phase locked loop, a frequency locked loop and a delay locked loop; and the oscillator and element being coupled to the locked loop circuit such that a temperature independent multiplied frequency is provided.

2. The frequency synthesizer of claim 1, wherein the at least one frequency multiplication element is a frequency divider.

3. The frequency synthesizer of claim 2, wherein the divider is a multi-modulus divider.

4. The frequency synthesizer of claim 3, wherein the divider is a dual-modulus divider.

5. The frequency synthesizer of claim 2, wherein the divider is connected in a feedback path of the loop circuit.

6. The frequency synthesizer of claim 2, wherein the divider is connected in a signal path of the oscillator.

7. The frequency synthesizer of claim 1, further comprising a control circuit including a temperature sensor and a memory being coupled to a temperature compensation controller, the controller of the control circuit being coupled to the element and for controlling the element.

8. The frequency synthesizer of claim 7, further comprising a noise-shaping digital modulator connected in a control signal path of the control circuit.

9. The frequency synthesizer of claim 1, wherein the element is programmed to vary as a function of a fractional frequency multiplication factor.

10. The frequency synthesizer of claim 1, wherein the locked loop circuit is a phase locked loop including a phase detector being coupled to a loop filter which is coupled to a voltage controlled oscillator having an output, the output being coupled back to a first input of the phase detector through the element, the oscillator being coupled to a second input of the phase detector.

11. The frequency synthesizer of claim 1, wherein the locked loop circuit is a frequency locked loop including a frequency detector being coupled to a loop filter which is coupled to a voltage controlled oscillator having an output, the output being coupled back to a first input of the frequency detector through the element, the oscillator being coupled to a second input of the frequency detector.

12. The frequency synthesizer of claim 1, wherein the locked loop circuit is a delay locked loop including a delay detector being coupled to a loop filter which is coupled to a voltage controlled oscillator having an output, the output being coupled back to a first input of the delay detector through the element, the oscillator being coupled to a second input of the delay detector.

13. The frequency synthesizer with temperature compensation and frequency multiplication, comprising:

a temperature dependent frequency oscillator;

at least one multi-modulus frequency divider, the divider programmed to vary as a function of a temperature variation of the frequency oscillator and to vary as a function of a frequency multiplication factor;

at least one phase locked loop including a phase detector being coupled to a loop filter which is coupled to a voltage controlled oscillator having an output, the output being coupled back to a first input of the phase detector through at least one feedback path, the oscillator being coupled to a second input of the phase detector through at least one signal path;

a control circuit including a temperature sensor and a memory being coupled to a temperature compensation controller, the controller of the control circuit being coupled to the divider and for controlling the divider; and the divider being coupled to the phase locked loop such that a temperature independent multiplied output frequency is obtained.

14. The frequency synthesizer of claim 13, further comprising a noise-shaping digital modulator, the modulator being coupled between the controller and the divider.

15. The frequency synthesizer of claim 14, wherein the divider is connected in the at least one feedback path of the phase locked loop.

16. The frequency synthesizer of claim 14, wherein the divider is connected in the at least one signal path of the oscillator.

17. The frequency synthesizer of claim 13, further comprising at least one mixer and a second phase locked loop circuit, the at least one mixer being coupled to the at least one feedback path and the second phase locked loop circuit such that a frequency resolution of the phase locked loop is increased.

18. The frequency synthesizer of claim 14, further comprising at least one mixer and at least one feed forward path for the phase locked loop, the at least one mixer being coupled to the at least one feed forward path and the at least one feedback path such that a frequency resolution of the phase locked loop is increased.

19. The frequency synthesizer of claim 18, wherein the divider is connected in the at least one feed forward path.

20. The frequency synthesizer of claim 18, wherein the divider is connected in the at least one feedback path of the phase locked loop.

21. The frequency synthesizer of claim 18, wherein the divider is connected in the at least one signal path of the oscillator.

22. The frequency synthesizer of claim 14, wherein the divider is programmed to vary as a function of a fractional frequency multiplication factor.

23. A method of temperature compensating and multiplying a frequency output in a frequency synthesizer, comprising the steps of:

providing a temperature dependent frequency oscillator coupled to at least one frequency multiplication element being programmed to vary as a function of a temperature variation of the frequency oscillator and to vary as a function of a frequency multiplication factor;

measuring an ambient temperature value in proximity to the oscillator;

searching a lookup table for a predetermined temperature dependent control signal corresponding to the ambient temperature value and the frequency multiplication factor; and applying the control signal to the at least one frequency multiplication element such that a desired temperature compensated and multiplied output frequency is obtained from the synthesizer.

24. The method of claim 23, wherein the providing step includes the at least one frequency multiplication element having a noise-shaping digital modulator and being coupled to the at least one looked loop circuit selected from the group consisting of a phase locked loop, a frequency locked loop and a delay locked loop.

* * * * *